(12) United States Patent
Awad et al.

(10) Patent No.: US 11,469,729 B2
(45) Date of Patent: Oct. 11, 2022

(54) HYBRID RECEIVER FRONT-END

(71) Applicant: MEDIATEK Singapore Pte. Ltd., Singapore (SG)

(72) Inventors: Ramy Awad, San Jose, CA (US); Tamer Mohammed Ali, San Jose, CA (US); E-Hung Chen, San Jose, CA (US); Miguel Francisco Gandara, San Jose, CA (US)

(73) Assignee: MEDIATEK Singapore Pte. Ltd., Singapore (SG)

( * ) Notice: Subject to any disclaimer, the term of this patent is extended or adjusted under 35 U.S.C. 154(b) by 107 days.

(21) Appl. No.: 16/872,099

(22) Filed: May 11, 2020

(65) Prior Publication Data
US 2020/0395909 A1    Dec. 17, 2020

Related U.S. Application Data

(60) Provisional application No. 62/859,770, filed on Jun. 11, 2019.

(51) Int. Cl.
*H03G 3/10* (2006.01)
*H03G 3/00* (2006.01)
(Continued)

(52) U.S. Cl.
CPC .............. *H03G 3/001* (2013.01); *H03F 3/21* (2013.01); *H03G 3/30* (2013.01); *H04L 25/03885* (2013.01)

(58) Field of Classification Search
CPC ........ H03G 3/001; H03G 3/30; H03G 1/0029; H03G 5/28; H03G 3/3036; H03G 3/3042;
(Continued)

(56) References Cited

U.S. PATENT DOCUMENTS 8,964,825 B2 * 2/2015 Beukema ............ H04L 25/0296
375/232
9,385,695 B2 * 7/2016 Chen .................... H04L 25/0296
(Continued)

FOREIGN PATENT DOCUMENTS

CN    103259508 A    8/2013
CN    109450471 A    3/2019
(Continued)

OTHER PUBLICATIONS

Extended European Search Report for European Application No. 20179368.4 dated Oct. 27, 2020.
(Continued)

*Primary Examiner* — Khanh V Nguyen
(74) *Attorney, Agent, or Firm* — Wolf, Greenfield & Sacks, P.C.

(57) ABSTRACT

A receiver front-end includes a first variable-gain amplifier that performs attenuation; a continuous time linear equalizer coupled to the input or output of the first variable-gain amplifier, wherein a combination of the first variable-gain amplifier and the continuous time linear equalizer produces a processed signal; a plurality of track-and-hold circuits that sample the processed signal in an interleaved manner; and a plurality of second variable-gain amplifiers receiving input signals from the plurality of track-and-hold circuits respectively.

16 Claims, 6 Drawing Sheets

(51) Int. Cl.
*H03F 3/21* (2006.01)
*H03G 3/30* (2006.01)
*H04L 25/03* (2006.01)

(58) Field of Classification Search
CPC ...... H03G 1/0023; H03G 1/0088; H03F 3/21;
H03F 3/45183; H04L 25/03885; H04L
25/03878; H04B 1/16; H04B 1/0007
See application file for complete search history.

(56) References Cited

U.S. PATENT DOCUMENTS

| | | | |
|---|---|---|---|
| 9,602,116 B1* | 3/2017 | Le | H03M 1/121 |
| 9,654,310 B1 | 5/2017 | Chang | |
| 10,243,570 B1* | 3/2019 | Forey | H03L 7/0807 |
| 10,270,409 B1 | 4/2019 | Forey et al. | |
| 10,396,811 B1* | 8/2019 | Rankin | H03M 1/0604 |
| 10,608,848 B1* | 3/2020 | Azenkot | H04L 25/03057 |

FOREIGN PATENT DOCUMENTS

| | | |
|---|---|---|
| TW | 201315166 A | 4/2013 |
| TW | 201534160 A | 9/2015 |
| WO | WO 2016/134604 A1 | 9/2016 |

OTHER PUBLICATIONS

Ali et al., 6.4 A 180mW 56Gb/s DSP-Based Transceiver for High Density IOs in Data Center Switches in 7nm FinFET Technology. 2019 IEEE International Solid-State Circuits Conference—(ISSCC) Feb. 17, 2019:118-20.

Cao et al., A 500 mW ADC-based CMOS AFE with digital calibration for 10 GB/s serial links over KR-backplane and multimode fiber. IEEE Journal of Solid-State Circuits. Jun. 2010;45(6):1172-85.

Chen et al., Power optimized ADC-based serial link receiver. IEEE journal of solid-state circuits. Apr. 2012;47(4):938-51.

Duvvuri et al., Design and analysis of a current mode integrated CTLE with charge mode adaptation. Microelectronics Journal. Jul. 1, 2016 ;53:81-9.

Cevrero et al., 6.1 A l00Gb/s 1.1 pj/b PAM-4 RX with dual-mode 1-tap PAM-4/3-tap NRZ speculative DFE in 14nm CMOS FinFET. 2019 IEEE International Solid-State Circuits Conference—(ISSCC) Feb. 17, 2019:112-114.

Hudner et al., A 112Gb/s PAM4 Wireline Receiver using a 64-way Time-Interleaved SAR ADC in 16nm FinFET. 2018 IEEE Symposium on VLSI Circuits Jun. 18, 2018:47-48.

Lacroix et al., 6.2 A 60Gb/s PAM-4 ADC-DSP transceiver in 7nm CMOS with SNR-based adaptive power scaling achieving 6.9 pJ/b at 32dB loss. In2019 IEEE International Solid-State Circuits Conference—(ISSCC) Feb. 17, 2019:114-116.

* cited by examiner

HYBRID RECEIVER FRONT-END

RELATED APPLICATIONS

This application claims priority under 35 U.S.C. § 119(e) to U.S. Provisional Application Ser. No. 62/859,770, entitled "HYBRID RECEIVER FRONT-END" filed on Jun. 11, 2019, which is herein incorporated by reference in its entirety.

BACKGROUND

Receivers are used in electronics to receive signals transmitted through various transmission media, such as transmission lines, for example. Some types of receivers include analog-to-digital converters to convert the received signal into the digital domain. Receivers may include an analog front-end to condition the received analog signal prior to analog-to-digital conversion.

BRIEF SUMMARY

Embodiments relate to a receiver front-end, comprising: a first variable-gain amplifier that performs attenuation; a continuous time linear equalizer coupled to an input or output of the first variable-gain amplifier, wherein a combination of the first variable-gain amplifier and the continuous time linear equalizer produces a processed signal; a plurality of track-and-hold circuits that sample the processed signal in an interleaved manner; and a plurality of second variable-gain amplifiers receiving input signals from the plurality of track-and-hold circuits respectively.

The first variable-gain amplifier may not perform amplification.

The first variable-gain amplifier may have a flipped source-follower configuration.

The first variable-gain amplifier may have a programmable NMOS load to control a degree of the attenuation.

The programmable NMOS load may be controlled by a plurality of inverters.

The programmable NMOS load may be in parallel with a source-follower transistor of the first variable-gain amplifier.

The receiver front-end may further comprise a feedback path from a source of the source-follower transistor to a gate of the source-follower transistor to regulate a voltage at the gate of the source-follower transistor.

The continuous time linear equalizer may comprise a common-gate amplifier.

The common-gate amplifier may comprise a first transistor having a first source connected to an input of the common-gate amplifier and a first drain, and a feedback path from the input of the common-gate amplifier to a gate of the first transistor.

The feedback path may comprise an amplifier.

The common-gate amplifier may further comprise a second transistor having a second drain connected to the input of the common-gate amplifier and a second source connected to a ground terminal.

The common-gate amplifier may further comprise a resistor and an inductor between the first drain and a power terminal.

A quantity of the plurality of track-and-hold circuits may be greater than or equal to two and a quantity of the plurality of second variable-gain amplifiers may be equal to the quantity of the plurality of track-and-hold circuits.

An output of the first variable-gain amplifier may be coupled to an input of the continuous time linear equalizer.

An input of the first variable-gain amplifier may be coupled to an output of the continuous time linear equalizer.

A fixed attenuator may be coupled to an input of the first variable-gain amplifier or an input of the continuous time linear equalizer.

The receiver front-end may further comprise at least one buffer that buffers the processed signal.

This summary is provided by way of illustration and is not intended to be limiting.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

The inventors have recognized a number of disadvantages with existing analog front-ends for analog-to-digital converter (ADC) based receivers. A number of such analog front-ends are power inefficient, have significant variations in performance due to process, voltage and temperature variations, large area consumption, significant noise degradation, include the need for a high-voltage supply, have limited voltage headroom and have limited linearity, for example. With such analog front-ends, there may be a need to cascade a significant number of stages to achieve the target gain and peaking, which may reduce linearity.

In some embodiments, a receiver front-end includes a continuous time linear equalizer (CTLE) and a variable gain amplifier (VGA). A CTLE can partially reverse the low-pass filter effects of limited channel bandwidth. The CTLE may be a high-pass filter. A CTLE may be realized in the continuous-time domain. The use of a VGA can assist with the need to cover many different reception channels with different frequency characteristics. The gain needed can vary from large values when performing amplification to small values when performing attenuation. The gain step may need to be very small (<0.2 dB). VGAs as described herein can provide suitable characteristics. The inventors have recognized and appreciated that VGA attenuation can be implemented at full-rate without significant disadvantages, but providing gain in a VGA can be disadvantageous at full-rate. The inventors have recognized and appreciated that a discrete-time implementation of an amplifying VGA combined with interleaving allows for lower-rate implementations.

In some embodiments, a receiver front-end includes a first VGA in the continuous-time domain that only performs attenuation (it does not perform amplification). The receiver front-end may also include a CTLE in the continuous-time domain. The receiver front-end also may include a plurality of interleaved VGAs in the discrete-time domain configured to perform amplification. By using interleaving and moving the amplifying VGAs to the discrete-time domain at a lower rate, a number of advantages may be realized. Lower bandwidth requirements can enable feedback-based amplifying VGAs to be used, which may improve linearity and stability to process, voltage and temperature variations. The linearity specifications of the CTLE and track-and-hold (T/H) circuits may be reduced by limiting their output swing. At a reduced sampling rate the amplifying VGA is more power efficient and can achieve a larger gain at a lower bit-rate than at full bit-rate. At a reduced sampling rate the amplifying VGA may have no need for inductors, which leads to a large area savings and better pulse response (i.e., reduced ringing).

Figure 1:
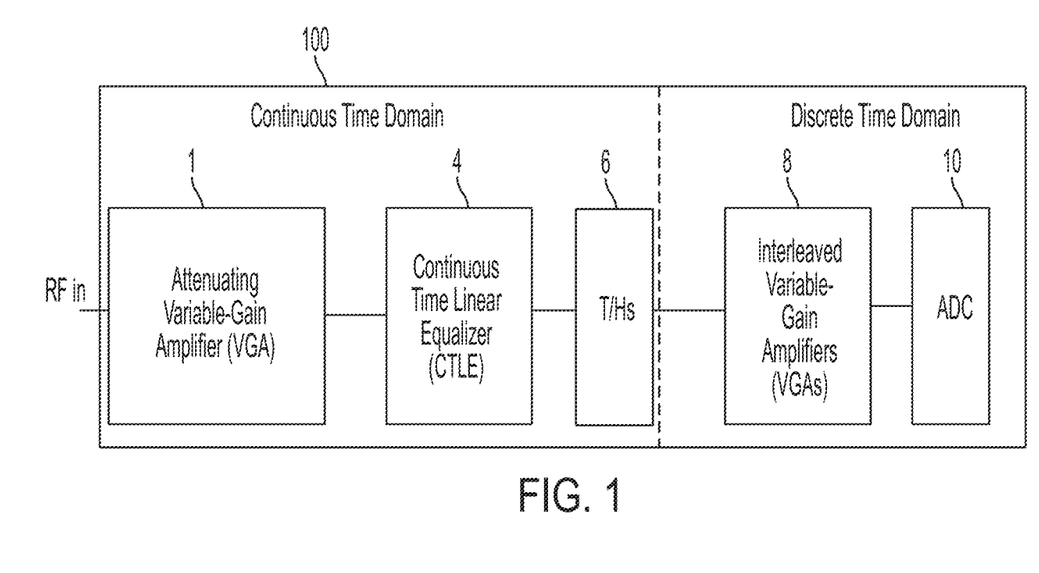
FIG. 1 shows a block diagram of a receiver front-end (RFE), according to some embodiments.

FIG. 1 shows a block diagram of a receiver front-end (RFE) 100, according to some embodiments. RFE 100 includes an attenuating variable-gain amplifier (VGA) 1 that receives an RF input and provides its output to CTLE 4. VGA 1 and CTLE 4 are both in the continuous-time domain. The output of CTLE 4 may be provided to track-and-holds (T/Hs) 6 which sample the output of the CTLE 4 in a time-interleaved manner. The output of T/Hs 6, each of which is at a fraction of full rate, may be provided to the input of interleaved VGAs 8 in the discrete-time domain. The interleaved VGAs 8 may perform amplification and provide an output to an analog-to-digital converter (ADC) 10 to convert the received signals into the digital domain.

In some embodiments, RFE 100 may be configured to receive data transmitted at a rate of more than 10 Gb/s, more than 20 Gb/s, more than 30 Gb/s, more than 40 Gb/s, more than 50 Gb/s, or more than any other suitable value. In some embodiments, RFE 100 may be configured to receive data transmitted at a rate between 40 Gb/s and 80 Gb/s, or within any range within such range. However, the techniques and apparatus described herein are not limited to a particular data rate.

In some embodiments, VGA 1 may provide only attenuation or unity gain, and no amplification, such that the gain of VGA 1 is less than one. The attenuation of VGA 1 may be controllable to adjust for different signal conditions. By providing only attenuation in VGA 1, VGA 1 may have relatively low power consumption.

Figure 2:
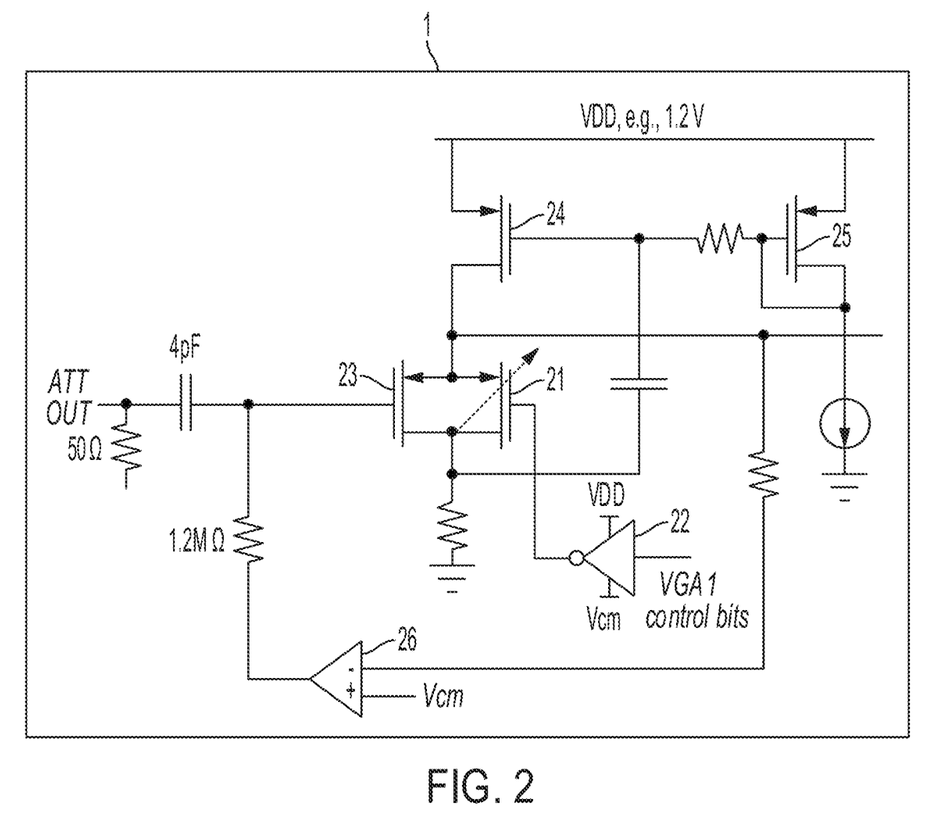
FIG. 2 shows an example of a circuit implementation of an attenuating VGA, according to some embodiments.

One example of a circuit implementation of VGA 1 is illustrated in FIG. 2. FIG. 2 shows that VGA 1 may be implemented in a flipped source-follower configuration with a programmable NMOS load. Such a configuration can achieve wide bandwidth, good power efficiency, good fan-out and linearity. NMOS load transistors 21 may be realized by a plurality of NMOS transistors connected in parallel to provide very fine steps of impedance adjustment to adjust the gain of VGA 1. NMOS transistors 21 may be driven by inverters 22 based on a plurality of input control bits that set the degree of attenuation performed by NMOS load transistors 21. The VGA 1 may also include a source-follower transistor 23 having its gate coupled to the input of the VGA 1, its drain coupled to ground through a resistor, and its source serving as the output terminal. VGA 1 may also include current mirror transistors 24 and 25. VGA 1 may also include a feedback path extending from the source of transistor 23 to a comparator 26 that maintains a common-mode voltage bias (Vcm) at the gate of transistor 23. However, it should be appreciated that the flipped source-follower configuration of FIG. 2 is an example, and that VGA 1 may be implemented by other suitable circuit configurations.

Figure 3:
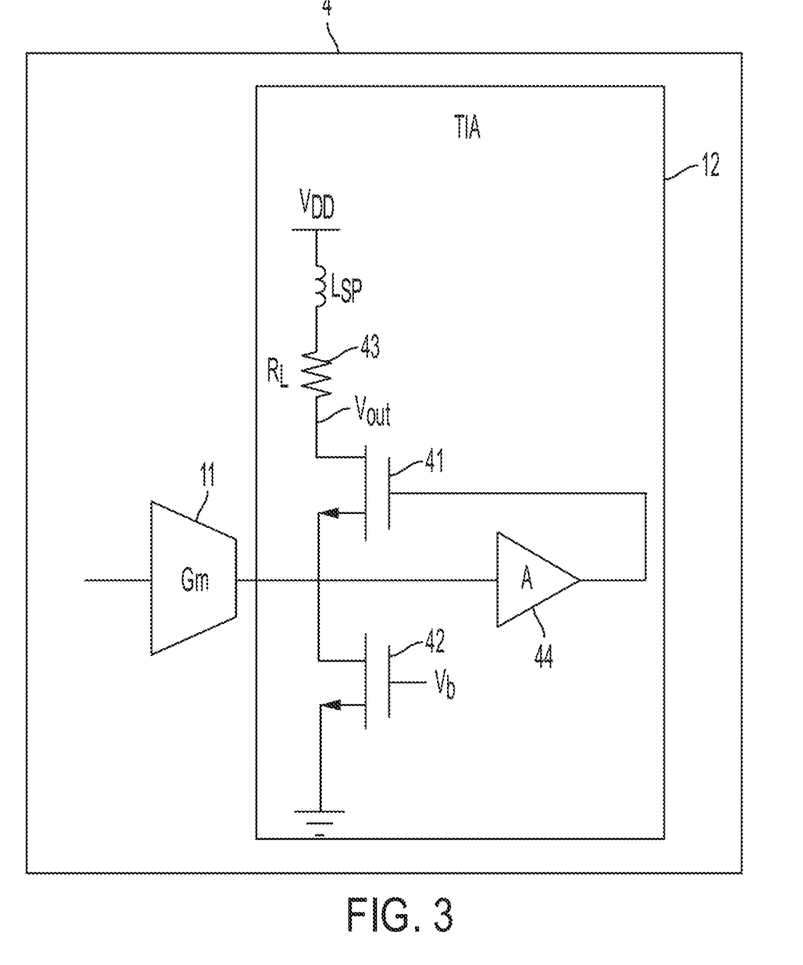
FIG. 3 shows an example of a continuous-time linear equalizer (CTLE) having a transimpedance amplifier (TIA) with a regulated common-gate circuit configuration, according to some embodiments.

FIG. 3 shows an example of CTLE 4, according to some embodiments. The CTLE 4 may include a $G_m$ stage 11 and a transimpedance amplifier (TIA) 12. In some embodiments, TIA 12 may be implemented by a regulated common-gate circuit configuration, as illustrated in FIG. 3. The input of the TIA 12 may be connected to the output of the $G_m$ stage 11 at the connection point between transistors 41 and 42. A first transistor 42 may have its source connected to ground and its drain connected to the input of the TIA 12. The drain of transistor 42 may be biased at a bias voltage $V_b$. A second transistor 41 has its source connected to the input of the TIA 12 and its drain connected to a resistor $R_L$. Resistor $R_L$ has a first terminal connected to the drain of transistor 41 and a second terminal connected to an inductor $L_{sp}$. Inductor $L_{sp}$ has a first terminal connected to resistor 43 and a second terminal connected to $V_{DD}$. Inductor $L_{sp}$ may improve bandwidth, but is optional. In some embodiments, inductor $L_{sp}$ may be omitted and the second terminal of the resistor 43 may be connected to $V_{DD}$. Regulation is provided by amplifying the input provided to the TIA 12 by amplifier 44 and feeding back the amplified input signal to the gate of transistor 41. However, it should be appreciated that the regulated common-gate circuit configuration of FIG. 3 is an example, and that CTLE 4 may be implemented by other suitable circuit configurations.

Figure 4:
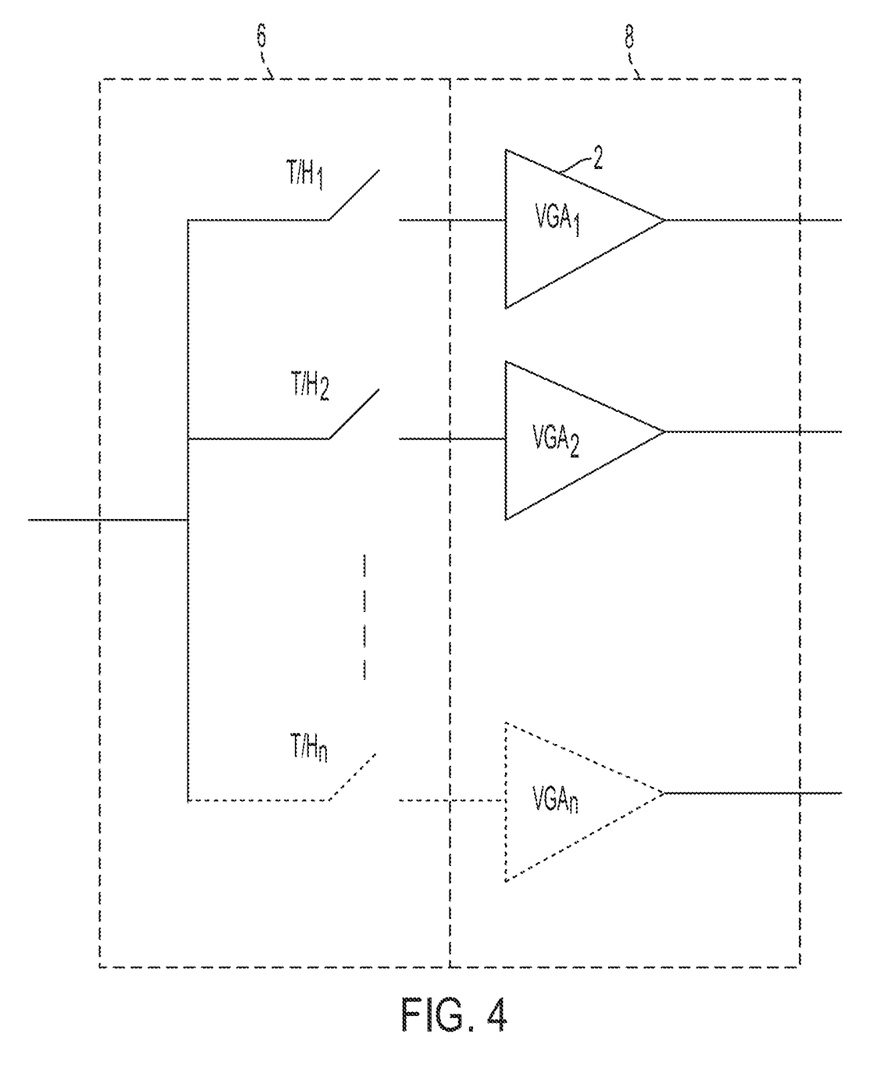
FIG. 4 illustrates the T/Hs and VGAs of the RFE, according to some embodiments.

FIG. 4 illustrates T/Hs 6 and VGAs 8. T/Hs 6 sample the incoming signal from the CTLE in an interleaved manner. For example, $T/H_1$ may take a first sample, then $T/H_2$, may take a sample at an appropriate phase delay, and so on until $T/H_n$ takes a sample. The phase delays between samples by respective T/Hs may be the clock period divided by the number of T/Hs. Any number n of T/Hs may be included, where n is a positive integer greater than or equal to two. The number of VGAs 8 may be equal to the number of T/Hs. Each T/H may provide a sample to its respective VGA 8.

Figure 5:
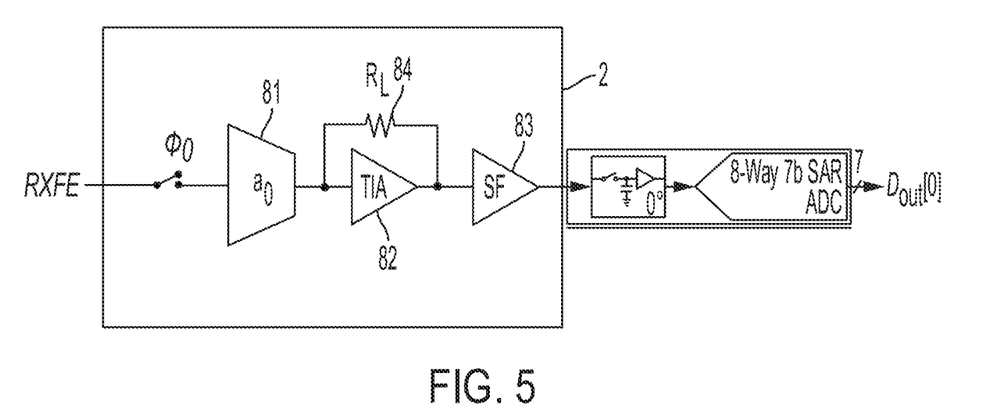
FIG. 5 shows an example of an amplifying VGA having an amplification block, a TIA, an output stage and a feedback resistor, according to some embodiments.

FIG. 5 shows an example of a VGA 2 having an amplification block 81, a TIA 82, an output stage 83 and a feedback resistor 84. The amplification block 81 may be a $G_m$ stage that converts an incoming voltage into a current. In some embodiments, VGA 2 is implemented using feedback. The TIA 82 may convert the current from the amplification block 81 back into a current. By performing interleaving and reducing the rate of the incoming signal, such feedback techniques can reduce power consumption while providing suitable performance.

Figure 6:
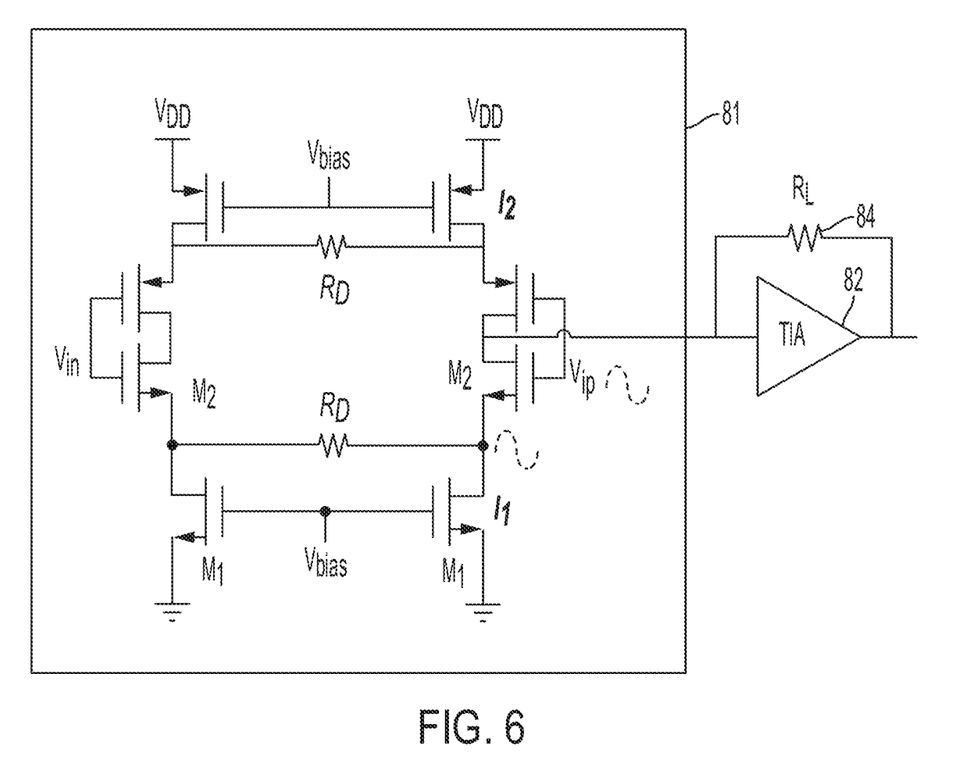
FIG. 6 shows an example of the amplification block 82 having an inverter-based configuration, according to some embodiments.

FIG. 6 shows an example of the amplification block 81 having an inverter-based configuration. In some embodiments, the gain of the VGA may be controlled by controlling $R_D$. Both NMOS and PMOS transistors contribute to the gain of the inverter-based Gm stage. The use of a PMOS/NMOS trans-conductance combination allows reusing the supply current, which improves energy efficiency. Such a configuration as shown in FIG. 6 can have double the Gm for the same current as compared to other Gm stage configurations. Such a configuration may allow for a smaller value of $R_L$ as compared to other Gm stage configurations, which results in lower noise and better bandwidth. However, it should be appreciated that this is an example, and any of a variety of VGA configurations and amplification block configurations may be used.

Figure 7:
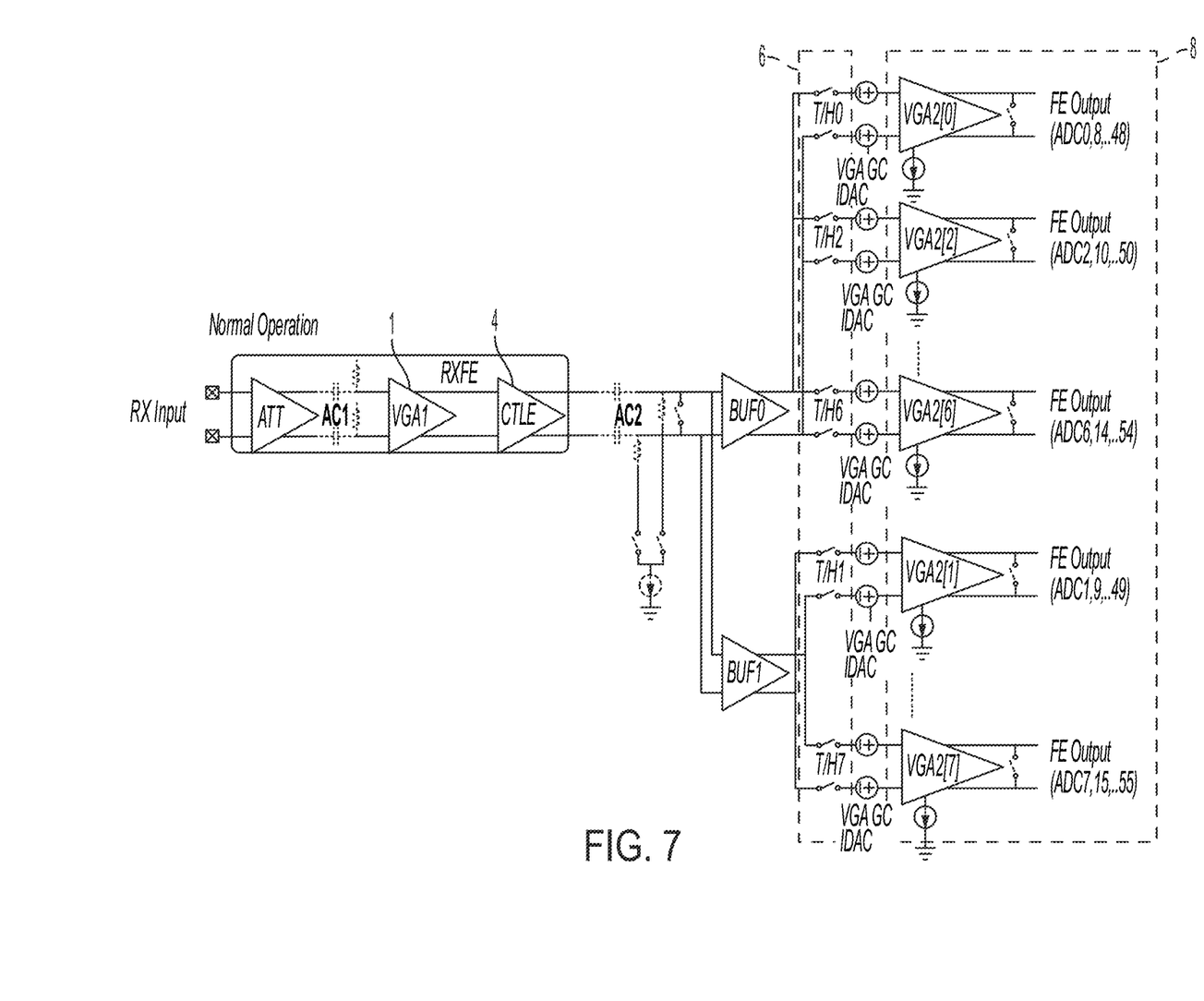
FIG. 7 shows a more detailed example of the RFE of FIG. 1, according to some embodiments.

FIG. 7 shows a more detailed example of the RFE 100, according to some embodiments. As illustrated, an optional fixed attenuator may precede the VGA 1 and/or the CTLE 4. The CTLE may follow the VGA 1, as shown in FIGS. 1 and 8. However, in some embodiments, the locations of the VGA 1 and CTLE 4 may be reversed, and the CTLE 4 may precede the VGA 1. One or more signal buffers BUF0, BUF1, etc., may follow the VGA 1 and/or CTLE. The voltage source symbols following the T/Hs represent optional random offset-mismatch calibration hardware. In this example, there are eight T/Hs 6 and eight VGAs 8, which can reduce the rate of the signals processed by the VGAs 8 by a factor of eight. For example, instead of having a single VGA 8 sampling at full-rate (e.g., 112 Gbps), each of the eight VGAs 8 may sample at a rate of 14 Gbps, which reduces the requirements of the VGAs 8.

Various aspects of the apparatus and techniques described herein may be used alone, in combination, or in a variety of arrangements not specifically discussed in the embodiments described in the foregoing description and is therefore not limited in its application to the details and arrangement of components set forth in the foregoing description or illustrated in the drawings. For example, aspects described in one embodiment may be combined in any manner with aspects described in other embodiments.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including", "comprising", "having", "containing" or "involving" and variations thereof herein, is meant to encompass the items listed thereafter and equivalents thereof as well as additional items.

The use of "coupled" or "connected" is meant to refer to circuit elements, or signals, that are either directly linked to one another or through intermediate components.

What is claimed is:

1. A receiver front-end, comprising:
   a first attenuating variable-gain amplifier that has a gain less than one;
   a continuous time linear equalizer coupled to an input or output of the first attenuating variable-gain amplifier, wherein a combination of the first attenuating variable-gain amplifier and the continuous time linear equalizer produces a processed signal;
   a plurality of track-and-hold circuits that sample the processed signal in an interleaved manner; and
   a plurality of second variable-gain amplifiers receiving input signals from the plurality of track-and-hold circuits respectively.

2. The receiver front-end of claim 1, wherein the first attenuating variable-gain amplifier has a flipped source-follower configuration.

3. The receiver front-end of claim 1, wherein the first attenuating variable-gain amplifier has a programmable MOS load to control a degree of the attenuation.

4. The receiver front-end of claim 3, wherein the programmable MOS load is controlled by a plurality of inverters.

5. The receiver front-end of claim 3, wherein the programmable MOS load is in parallel with a source-follower transistor of the first attenuating variable-gain amplifier.

6. The receiver front-end of claim 5, further comprising a feedback path from a source of the source-follower transistor to a gate of the source-follower transistor to regulate a voltage at the gate of the source-follower transistor.

7. The receiver front-end of claim 1, wherein the continuous time linear equalizer comprises a common-gate amplifier.

8. The receiver front-end of claim 7, wherein the common-gate amplifier comprises a first transistor having a first source connected to an input of the common-gate amplifier and a first drain, and a feedback path from the input of the common-gate amplifier to a gate of the first transistor.

9. The receiver front-end of claim 8, wherein the feedback path comprises an amplifier.

10. The receiver front-end of claim 9, wherein the common-gate amplifier further comprises a second transistor having a second drain connected to the input of the common-gate amplifier and a second source connected to a ground terminal.

11. The receiver front-end of claim 10, wherein the common-gate amplifier further comprises a resistor and an inductor between the first drain and a power terminal.

12. The receiver front-end of claim 1, wherein a quantity of the plurality of track-and-hold circuits is greater than or equal to two and a quantity of the plurality of second variable-gain amplifiers is equal to the quantity of the plurality of track-and-hold circuits.

13. The receiver front-end of claim 1, wherein an output of the first attenuating variable-gain amplifier is coupled to an input of the continuous time linear equalizer.

14. The receiver front-end of claim 1, wherein an input of the first attenuating variable-gain amplifier is coupled to an output of the continuous time linear equalizer.

15. The receiver front-end of claim 1, further comprising a fixed attenuator coupled to an input of the first attenuating variable-gain amplifier or an input of the continuous time linear equalizer.

16. The receiver front-end of claim 1, further comprising at least one buffer that buffers the processed signal.

* * * * *